US007367138B2

(12) United States Patent
Sogard

(10) Patent No.: US 7,367,138 B2
(45) Date of Patent: *May 6, 2008

(54) DEVICES AND METHODS FOR THERMOPHORETIC AND ELECTROPHORETIC REDUCTION OF PARTICULATE CONTAMINATION OF LITHOGRAPHIC RETICLES

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 9 days.

This patent is subject to a terminal disclaimer.

(21) Appl. No.: 11/248,931

(22) Filed: Oct. 11, 2005

(65) Prior Publication Data

US 2007/0079525 A1 Apr. 12, 2007

(51) Int. Cl.
*F26B 3/34* (2006.01)
(52) U.S. Cl. .................. 34/275; 355/30; 250/504 R; 219/502; 430/403; 156/345.4
(58) Field of Classification Search ............ 34/274, 34/86, 90, 218, 275; 355/30; 250/504 R; 219/502; 430/403; 156/345.4
See application file for complete search history.

(56) References Cited

U.S. PATENT DOCUMENTS

| 5,373,806 | A | 12/1994 | Logar |
| 5,472,550 | A | 12/1995 | Periasamy |
| 6,153,044 | A | 11/2000 | Klebanoff et al. |
| 6,253,464 | B1 | 7/2001 | Klebanoff et al. |
| 6,781,673 | B2 | 8/2004 | Moors et al. |
| 2004/0000519 | A1* | 1/2004 | Jiang et al. .................. 210/634 |
| 2004/0119394 | A1* | 6/2004 | Klebanoff et al. .......... 313/356 |

OTHER PUBLICATIONS

U.S. Appl. No. 10/898,475, filed Jul. 23, 2004, Sogard.
MacGibbon et al., "The Effect of Thermophoresis on Particle Deposition in a Tungsten Low Pressure Chemical Vapor Deposition Reactor," Journal of The Electrochemical Soecity, 146 (8) 2901-2905 (1999).
Rader et al., "Verification studies of thermophoretic protection for EUV masks," Emerging Lithographic Technologies IV, Proceedings of SPIE vol. 4688, 2002, pp. 182-193.

* cited by examiner

*Primary Examiner*—S. Gravini
(74) *Attorney, Agent, or Firm*—Klarquist Sparkman, LLP

(57) ABSTRACT

Apparatus and methods are disclosed for reducing particle contamination of a surface of an object such as a reticle used in an EUV lithography system. An exemplary apparatus includes a thermophoresis device and an electrophoresis device. The thermophoresis device is situated relative to and spaced from the surface, and is configured to produce a thermophoretic force, in a gas flowing past and contacting the surface, sufficient to inhibit particles in the gas from contacting the surface. The electrophoresis device is situated relative to a region of the surface contacted by the gas and is configured to deflect particles, having an electrostatic charge, in the gas away from the region as the gas flows past the region. In an example, the thermophoresis device produces the thermophoretic force by establishing a temperature gradient in the gas relative to the surface, and the electrophoresis device includes an electrode situated and configured to produce a voltage gradient relative to the region of the surface sufficient to attract charged particles away from the region of the surface.

17 Claims, 8 Drawing Sheets

DEVICES AND METHODS FOR THERMOPHORETIC AND ELECTROPHORETIC REDUCTION OF PARTICULATE CONTAMINATION OF LITHOGRAPHIC RETICLES

FIELD

This disclosure pertains, inter alia, to microlithography, which is a key imaging and pattern-transfer technology employed in the fabrication of semiconductor devices such as integrated circuits, displays, and the like. More specifically, the disclosure pertains to microlithography in which extreme ultraviolet (EUV) light is used for transferring a pattern from a pattern-defining reticle to an exposure-sensitive substrate such as a semiconductor wafer. Even more specifically, the disclosure pertains to reducing particulate contamination of the reticle.

BACKGROUND

Extreme-ultraviolet lithography (EUVL) is currently regarded as a candidate "generation lithography" (NGL) that offers prospects of substantially finer pattern resolution than currently obtainable using conventional "optical" lithography (i.e., lithography performed using deep-ultraviolet wavelengths of light). These expectations of increased resolution from EUVL stem largely from the fact that, whereas current optical lithography is performed using a wavelength in the range of 150-250 nm, EUVL is performed using a wavelength in the range of 11-15 nm, which is at least ten times shorter than the conventional "optical" wavelengths. Generally, the shorter the wavelength of light used for pattern imaging in microlithography, the finer the obtainable resolution.

In view of the extremely small pattern elements (currently less than 100 nm) that can be resolved using microlithography, including EUVL, the accuracy and precision with which pattern transfer is performed lithographically must be extremely high to ensure proper placement and registration of multiple pattern layers on a substrate and to ensure that the pattern elements are transferred to the substrate with high fidelity. To obtain such high accuracy and precision, extreme measures are taken to control and remove extraneous causes of performance degradation. For example, with current expectations being demanded of microlithography systems to produce pattern features of less than 100 nm, eliminating significant particulate contamination has become paramount.

EUV light is highly attenuated by the atmosphere, and no currently known materials are adequately transmissive and refractive to EUV light for use as EUV lenses. Consequently, EUVL must be performed under high vacuum using reflective optics (mirrors) for illumination of the reticle and for projection of the illuminated pattern from the reticle to the substrate. Even the reticle is reflective rather than being a transmissive reticle as used in conventional optical microlithography.

In optical microlithography the reticle during use typically is protected by a pellicle from particulate contamination. (The pellicle is a transmissive thin film on a frame that covers the patterned surface of the reticle to prevent deposition of particles on the reticle surface.) A pellicle cannot be used with a reticle for EUVL because, in view of the lack of EUV-transmissive materials, the pellicle would absorb and thus block the EUV beam incident to the reticle, leaving substantially no EUV light for projecting the pattern image to the substrate. Thus, the EUVL reticle must be used naked, which leaves the reticle vulnerable to particulate contamination during use. In optical lithography in which the reticle is protected by a pellicle, a particle deposited on the pellicle is sufficiently displaced from the plane of the reticle (i.e., outside the depth of focus) to be unresolved (or at most poorly resolved) on the wafer. A particle on a naked EUVL reticle, on the other hand, is in the plane of the reticle pattern and hence is resolved on the wafer where it likely will flaw the projected pattern image. Hence, for EUVL reticles, particle protection as effective as a pellicle is required.

In EUVL systems currently under development, the reticle is used facing downward, which is helpful in preventing deposition of particles on the reticle surface. However, merely facing the reticle downward is insufficient for keeping the reticle completely clean, and various techniques currently are being developed that are aimed at preventing deposition of any particulate contamination on the reticle without having to use a pellicle. One technique that exhibited remarkable success in preventing particulate deposition on the reticle (by preventing particles from hitting the reticle) is termed "thermophoresis," discussed in Rader et al., "Verification Studies of Thermophoretic Protection for EUV Masks," *Proceedings SPIE* 4688:182-193, 2002. See also U.S. Pat. Nos. 6,153,044 and 6,253,464. Thermophoresis refers to a force exerted on particles in a gas where a temperature gradient is present, wherein the particles are driven by a thermophoretic "force" (imparted by the gas) from a warmer region to a cooler region. Thus, a surface can be protected from particle deposition by maintaining the surface at a warmer temperature than its surroundings.

General principles of thermophoresis as applied in an EUVL system are described with reference to FIG. 8, which depicts a reticle 222 and a nearby surface 226 that is maintained at a cooler temperature than the reticle 222. The cooler surface 226 may be, for example, a differential pumping barrier used in a vacuum chamber housing the reticle 222 or a shield that protects the reticle. A gas in the vicinity of the reticle 222 and the surface 226 exhibits a temperature gradient in which the gas is warmer near the reticle 222 and cooler near the surface 226. The thermophoretic "force" associated with the gradient urges particles 228 away from the warmer reticle 222 toward the cooler surface 226. Some particles 228 may actually become attached to the surface 226. Thermophoretic forces are greatest in the presence of a sufficient gas pressure in which the mean free path of the gas molecules is a small fraction of the distance from the reticle 222 and the surface 226. As pressure is decreased (i.e., as vacuum is increased), thermophoretic forces decrease correspondingly. In other words, thermophoresis is poorly effective in high vacuum, but at a pressure of 50 mTorr thermophoresis is still significant for effectively urging particles 228 away from the reticle 222.

A conventional thermophoretic scheme as disclosed in the references cited above is generally shown in FIG. 9, which depicts a portion of an EUVL system 100 in the vicinity of the reticle. The depicted system 100 comprises a vacuum chamber 104 including a first region 108 and a second region 110. The first region 108 contains a reticle stage 114 that supports a reticle chuck 118 configured to hold a reticle 122 face-down. The second region 110 contains projection optics 124 and a wafer stage (not shown). The first and second regions 108, 110 are substantially separated from each other by a barrier wall 126 through which an opening 130 is defined. The barrier wall 126 and opening 130 collectively form a differential pumping barrier. The opening 130 is sufficiently large to pass EUV light incident to and reflected from the reticle 122. Gas at a pressure of approximately 50 mTorr is supplied to the first region 108 via a gas-supply port 132 in the vacuum chamber 104. To minimize EUV-absorption losses to ambient gas, the second region 110 is maintained at a lower pressure (i.e., higher vacuum; e.g., $\leq 1$ mTorr) than the first region 108. Maintaining these two respective pressures in the regions 108, 110 is achieved by differential evacuation of the regions, performed using respective vacuum pumps 134, 136 and facilitated by the differential pumping barrier.

In the configuration shown in FIG. 9, to remove particles away from the reticle 122 by thermophoresis, the reticle is maintained at a higher temperature than the barrier wall 126. This temperature differential, as discussed above, results in attraction of the particles to the barrier wall 126, which causes some particles (entrained in gas passing through the opening 130) to enter the second region 110 via the opening 130. The flow of gas from the region 108 to the region 110 also helps convey particles away from the reticle 122 and thus prevents the particles from contacting the reticle.

While placing a cooler surface proximal to a warmer reticle helps reduce particulate contamination of the reticle, maintaining surfaces of different temperatures within the EUVL system can be problematic. For example, maintaining surfaces at different temperatures can complicate temperature control of critical subsystems and can generate issues relating to thermal expansion and distortion of critical components. For example, thermal expansion or distortion of the reticle can compromise the performance of the overall EUVL lithography process and hence of the semiconductor-device-fabrication process. Also, flowing gas from the region 108 to the region 110 may sweep particles originating in the region 108 toward the reticle 122, which would increase the risk of contamination despite the general protection afforded by thermophoresis.

Other manners of solving this problem are described elsewhere by the current Applicant, namely U.S. patent application Ser. No. 10/898,475, entitled "Extreme Ultraviolet Reticle Protection Using Gas Flow Thermophoresis," filed on Jul. 23, 2004, and a corresponding PCT CIP Application, entitled "Extreme Ultraviolet Reticle Protection," filed on Jul. 23, 2005, both of which being incorporated herein by reference. Briefly, a space is defined between the reticle and a nearby surface, such as a barrier wall or reticle shield. At least one gas nozzle is situated in the space. A gas, cooled to below the temperature of the reticle and surface (the reticle and surface normally have substantially the same temperature), is discharged from the nozzle(s) into the space. The discharged gas, flowing substantially parallel to the reticle, establishes local temperature gradients adjacent the reticle and surface, respectively. The temperature gradients engender respective thermophoretic forces tending to urge particles away from the reticle and surface so that the particles become or remain entrained in the gas.

A particular configuration of the apparatus 300 described in the '475 application is shown in FIG. 10, which depicts a reticle 302 supported by a reticle chuck 304 mounted face down on a reticle stage 306. The reticle stage 306, reticle chuck 304, and reticle 302 are contained in a reticle chamber 308 that is separated from a projection-optics chamber 310 by a barrier wall 312 (e.g., a differential pumping barrier or reticle shield). The barrier wall 312 defines an aperture 314 that is sized and configured to allow illumination EUV light 316 to impinge on the desired region of the reticle 302 and to pass patterned EUV light 318 reflected from the reticle to the projection optics (not shown). The aperture 314 also helps establish and maintain the differential pressures in the two chambers 308, 310 (the reticle chamber 308 is typically at approximately 50 mTorr, and the projection-optics chamber 310 is typically at less than 1 mTorr). During exposure, to illuminate successive regions of the reticle 302, the reticle stage 306 moves in a scanning manner relative to the aperture 314. Flanking the aperture 314 and extending upward (in the figure) toward the reticle 302 is a nozzle manifold 320a, 320b that defines nozzle openings 322a, 322b for discharging the gas. The nozzle openings 322a, 322b are oriented so as to discharge the gas into the space 324 (between the reticle 302 and the barrier wall 312) in a direction substantially parallel to the reticle. The flow of gas (note arrows 326) past the reticle 302 is approximately laminar.

As noted above, the gas can be cooled before discharging the gas into the space 324 between the reticle 302 and barrier wall 312. Alternatively, the nozzle openings 322a, 322b are sized and configured to establish a substantially higher gas pressure at the nozzle openings than in the space 324. Thus, discharge of the gas is accompanied by adiabatic cooling of the gas. I.e., as the gas is discharged into the space 324, it expands rapidly out of the nozzle openings 322a, 322b and cools significantly in the process. With such a configuration, the discharged gas is colder than the reticle 302 and barrier wall 312 and establishes the desired temperature gradient without having to pre-cool the gas. In addition, the relatively high gas pressure at the nozzle openings 322a, 322b produces a high gas-flow velocity through the space 324. This high-velocity flow establishes a substantial viscous-drag force on particles and tends to convey the particles out of the space 324 and thus away from the reticle 302.

As indicated by the multiple arrows 326, most of the discharged gas (and entrained particles) flows laterally as shown, substantially parallel to the reticle 302, through the space 324 and is exhausted via the vacuum pump (not shown but see item 134 in FIG. 9) that evacuates the reticle chamber 308.

Referring further to FIG. 10, the nozzle manifold 320a, 320b extends upward (in the figure) and forms respective narrow gaps G between the "tops" of the nozzle manifold and the surface of the reticle 302. These gaps G, each approximately 1 mm or less, allow limited movement of the reticle 302 (in the vertical, or "z," direction) as required for focus control and reticle-wafer alignment movements. The narrow gaps G also allow a limited flow of gas (note single arrows 330 compared to multiple arrows 326) from the space 324 through the aperture 314 to the projection-optics chamber 310. The gas flow through the gaps G is limited so as to maintain the desired vacuum level in the projection-optics chamber 310 for minimal attenuation of the EUV illumination and patterned beams.

In the scheme summarized above the pressure in the gaps G is substantially lower than, for example, the pressure in the space 324 between the reticle 302 and the barrier wall 312. This reduced pressure produces a correspondingly reduced thermophoretic "force" in the gaps G compared to elsewhere on the reticle 302. Consequently, particles urged into these gaps by the higher-velocity gas flow near the nozzle openings 322a, 322b have opportunities to contact the reticle 302 and become attached to it.

Therefore, a need exists for methods and devices for reducing this source of particulate contamination of the reticle.

SUMMARY

The foregoing need is met by apparatus and methods as disclosed herein.

According to a first aspect, apparatus are provided for reducing particle contamination of a surface of an object. An embodiment of such an apparatus comprises a thermophoresis device and an electrophoresis device. The thermophoresis device is situated relative to and spaced from the surface and is configured to produce a thermophoretic force, in a gas flowing past and contacting the surface, sufficient to inhibit particles in the gas from contacting the surface. The electrophoresis device is situated relative to a region of the surface contacted by the gas and is configured to deflect particles, having an electrostatic charge, in the gas away from the region as the gas flows past the region. The thermophoresis device desirably produces the thermophoretic force by establishing a temperature gradient in the gas relative to the surface. In this configuration the electrophoresis device desirably comprises an electrode that is situated and configured to produce a voltage gradient relative to the region of the surface sufficient to attract charged particles away from the region of the surface.

The object can be a lithographic reticle having a patterned surface including the region, wherein the region is irradiated by a lithographic energy beam propagating to the reticle along an irradiation path. In this configuration the thermophoresis device desirably is configured to deliver a flow of the gas in a first direction relative to the surface, wherein the gas desirably is at a temperature appropriate for producing the thermophoretic force. The thermophoresis device desirably directs a portion of the gas flow, in the vicinity of the region, in a second direction that is opposite the first direction and then away from the region along a trajectory including at least a portion of the irradiation path so as to allow the lithographic energy beam to impart charges to the particles in the directed portion of the gas flow in the second direction. The electrophoresis device desirably is configured to deflect the charged particles, in the directed portion of the gas flow, away from the region. If the lithographic energy beam is a beam of extreme ultraviolet light, the reticle typically is a reflective reticle.

Another embodiment of an apparatus for reducing particle contamination of a surface of an object comprises a thermophoresis device and an electrophoresis device. The thermophoresis device is configured to flow a gas stream in a space substantially parallel to the surface of the object, wherein the gas stream has a temperature lower than a temperature of the surface so as to establish a thermophoretic temperature gradient between the gas and the surface. The temperature gradient creates a thermophoretic force that inhibits particles from contacting the surface. The electrophoresis device is situated relative to the surface and the thermophoresis device and comprises at least one electrode situated in the gas stream. The at least one electrode is configured, when energized, to establish a voltage gradient in the gas stream urging migration of charged particles in the gas away from the surface. The thermophoresis device desirably comprises a gas-discharge nozzle that produces the gas stream by discharging the gas stream in a manner by which the gas is adiabatic cooled so as to establish the thermophoretic temperature gradient. The thermophoresis device can be further configured to bleed off a portion of the gas stream, in a space adjacent a region of the surface, to the electrophoresis device. The at least one electrode of the electrophoresis device desirably is connected to a DC-voltage source.

The object can be a lithographic reticle having a patterned surface that is configured to be irradiated by a lithographic energy beam under a vacuum condition. In this configuration the lithographic reticle can be contained in a first vacuum chamber that is separated by a barrier wall from a second vacuum chamber, wherein the barrier wall defines an opening allowing the first and second vacuum chambers to communicate with each other. The opening can be situated so as to allow the lithographic energy beam to pass from the second vacuum chamber to the first vacuum chamber in which the lithographic energy beam illuminates a selected region on the lithographic reticle and reflects, as a patterned beam from the selected region, back into the second vacuum chamber.

The reticle in the first vacuum chamber can be situated substantially parallel to the barrier wall, thereby defining a substantially uniform-width space between the reticle and the barrier wall. In this configuration the thermophoresis device can be configured to flow the stream of gas substantially parallel to the reticle and barrier wall through the space, and to bleed off a portion of the stream through the opening from the space into the second chamber away from the reticle. The at least one electrode of the electrophoresis device attracts the charged particles, in the bled-off portion of the stream exiting the first chamber through the opening, to move away from the reticle.

As noted above, the lithographic energy beam can be a beam of extreme ultraviolet light. In this configuration the lithographic energy beam can have sufficient energy to impart charges to particles entrained in the bled-off portion of the gas stream, so as to render the particles attractive to the at least one electrode.

Yet another embodiment of an apparatus for reducing particle contamination of a surface of an object comprises a member having a surface that is proximal to the object surface but separated a first distance from the object surface so as to define a first space between the surfaces. The member defines an opening adjacent a region of the object. The apparatus includes a nozzle manifold that is mounted to the member in the first space and is configured to supply a gas into the first space such that a first portion of the supplied gas flows substantially parallel to the object surface and in a manner that establishes a thermophoretic force in the first space. The thermophoretic force inhibits particles from contacting the object surface. A second portion of the supplied gas flows substantially parallel to the region and then away from the object through the opening, wherein the flow of the second portion is constrained relative to the flow of the first portion of the supplied gas. The apparatus also includes at least one electrophoresis electrode that is mounted to the nozzle manifold and is configured to produce an electric field sufficient to attract charged particles, in the second portion of the supplied gas, away from the object surface as the second portion flows through the opening. The electrophoresis electrode can be configured to establish, when energized, the electric field between the object and the electrophoresis electrode by a voltage applied to the electrode relative to the object. The first and second portions of the supplied gas can flow substantially parallel to the object but in different respective directions.

The nozzle manifold can be situated adjacent the opening. In this configuration the nozzle manifold can be oriented and configured to supply the gas such that the first portion of the supplied gas flows approximately laminarly through the first space away from the opening, and the second portion of the supplied gas flows approximately laminarly toward the opening.

The nozzle manifold can extend from the member surface toward the object surface and can define a surface that is separated from the object surface a second distance that is less than the first distance so as to define a second space that is narrower than the first space, thereby providing a lesser flow of the supplied gas through the second space compared to through the first space. The surface of the nozzle manifold can comprise the electrophoresis electrode. The nozzle manifold can be configured to discharge the gas while cooling the gas adiabatically as the nozzle manifold supplies the gas into the first space. The gas supplied by the nozzle manifold can have a lower temperature than either the member surface or the object surface.

The opening defined by the member can be configured as a fixed aperture through which a radiation beam is directed to the region of the object surface. In this configuration the radiation beam can be a beam of extreme ultraviolet light having sufficient energy to impart a charge to at least some of the particles as the second portion of the gas, including particles, enters the opening.

The object can be situated in a first chamber that is maintained at a first pressure, wherein the member separates the first chamber from a second chamber that is maintained at a second pressure that is lower than the first pressure. The resulting pressure difference causes the second portion of the supplied gas to flow from the first chamber through the opening to the second chamber. By way of example, the opening can be configured as a differential pumping aperture. The opening also can be configured as an illumination aperture for transmitting a radiation beam to the object.

Yet another embodiment of an apparatus for reducing particle contamination of a surface of an object comprises thermophoresis means for producing a thermophoretic force, in a gas flowing past and contacting the surface, sufficient to inhibit particles in the gas from contacting the surface. The apparatus also comprises electrophoresis means for deflecting particles, having an electrostatic charge, in the gas away from a region of the object surface contacted by the gas as the gas flows past the region.

Yet another embodiment of an apparatus for reducing particle contamination of a surface of an object comprises thermophoresis means for flowing a gas stream, having a temperature lower than a temperature of the surface, in a space substantially parallel to the surface so as to establish a thermophoretic temperature gradient between the gas and the surface. The thermophoresis means is also for creating, from the temperature gradient, a thermophoretic force that inhibits particles from contacting the surface. The apparatus also comprises electrophoresis means for establishing a voltage gradient that urges migration of charged particles in the gas stream away from the surface.

Yet another embodiment of an apparatus for reducing particle contamination of a surface of an object comprises member means for providing a surface that is separated a first distance from the object surface, for defining a first space between the surfaces, and for defining an opening adjacent a region of the object. The apparatus also comprises gas-discharge means for supplying a gas into the first space such that a first portion of the discharged gas flows substantially parallel to the object surface and a second portion of the discharged gas flows substantially parallel to the region and then away from the object through the opening. The gas has a lower temperature than the object surface, which establishes a thermophoretic force in the first space that inhibits particles in the gas from contacting the object surface. The apparatus includes electrophoresis means for producing an electric field sufficient to attract charged particles, in the second portion of the supplied gas, away from the object surface as the second portion flows through the opening.

Another aspect is directed, in the context of an EUV lithography system, to apparatus for reducing particulate contamination of a surface of a reticle that is contained in a reticle chamber evacuated to a vacuum level during use of the reticle. An embodiment of such an apparatus comprises a reticle-shield member having a surface that is proximal to and substantially parallel to the surface of the reticle but separated a first distance from the reticle surface so as to define a first space between the surfaces. The shield member defines an opening that is configured to transmit a beam of EUV radiation to a selected region of the reticle surface for illuminating the region. The apparatus includes a gas nozzle manifold that is situated and configured to supply a gas into the first space such that a first portion of the supplied gas flows in the first space. The gas is at an appropriate temperature relative to the temperature of the reticle-shield member, the gas flow is at an appropriate pressure and flow rate, and the gas flow is substantially parallel to the reticle surface to produce a thermophoretic force in the first space sufficient for inhibiting particles in the gas from contacting the reticle surface. A second portion of the supplied gas flows relative to the region and then away from the reticle through the opening. The apparatus includes at least one electrophoresis electrode situated relative to the opening and the region. The electrode is configured to produce an electric field sufficient to attract charged particles, in the second portion of the supplied gas, away from the reticle surface in the region as the second portion flows through the opening. The opening desirably has a shape corresponding to a shape of an illumination region on the reticle surface, and can be configured as a fixed aperture. The nozzle manifold can be situated adjacent the opening and can extend toward the reticle surface so as to define a second space, between a top surface of the gas port and the reticle surface, that is thinner than the first space. The second space establishes a bleed rate, relative to gas flow through the first space, of gas flow through the second space and out through the opening.

The at least one electrode can be situated on the top surface of the gas port. In this configuration the apparatus further can comprise a dielectric layer situated between the at least one electrode and the top surface of the gas port.

The reticle-shield member can separate the reticle chamber from a downstream optics chamber. In this configuration the nozzle manifold can be situated adjacent the opening and can extend toward the reticle surface so as to define a second space, between a top surface of the nozzle manifold and the reticle surface, that is thinner than the first space. Thus, a bleed rate (relative to gas flow through the first space) of gas flow is established through the second space and out through the opening. The at least one electrode can be situated on the top surface of the nozzle manifold.

According to another aspect, methods are provided for reducing particulate contamination of a surface of an object. In an embodiment of such a method, one step comprises delivering a gas relative to the object such that the gas contacts the object surface, wherein the gas has a lower temperature than the object surface. In another step a thermophoretic force is produced in the gas that is sufficient to inhibit particles from contacting the surface. In yet another step an electrophoretic force is produced in a region of the surface contacted by the gas. The electrophoretic force is sufficient to deflect particles, having an electrostatic charge, in the gas away from the region.

In one example the gas is delivered so that the gas flows substantially parallel to the object surface. In another example the gas is delivered such that a first portion of the gas flows substantially parallel to the object surface in a first direction and a second portion of the gas flows in a second direction opposite the first direction and then away from the region. In this example the electrophoretic force can be produced so as to deflect particles in the second portion as the second portion flows past the region.

The method further comprises the step of irradiating the region, which can be performed using EUV radiation, wherein the object can be a reticle having a patterned surface including the region.

In another embodiment of a method for reducing particle contamination of a surface of an object, one step comprises producing a gas stream having a temperature lower than a temperature of the surface. The gas stream is substantially parallel to the surface so as to contact the surface and produce a thermophoretic force between the gas and the surface sufficient for inhibiting particles in the gas stream from contacting the surface. In another step an electrophoretic force is produced that is sufficient for urging migration of charged particles in the gas away from the surface.

In another embodiment of a method for reducing particle contamination of a surface of a lithographic reticle, one step comprises placing the reticle relative to a member having a surface that is separated a first distance from the reticle surface, so as to define a first space between the surfaces. The member defines an opening adjacent a region of the reticle surface. A gas flow is supplied into the first space such that a first portion of the gas flows relative to the reticle surface and a second portion of the gas flows relative to the region and then away from the reticle surface through the opening. A thermophoretic force is established in the first space to inhibit particles in the gas from contacting the reticle surface. An electric field is produced that is sufficient to attract charged particles, in the second portion of the supplied gas, away from the reticle surface as the second portion flows through the opening. This method embodiment further can comprise irradiating the region of the reticle surface while establishing the thermophoretic force and producing the electric field. The region can be irradiated with an electromagnetic radiation sufficient to ionize the particles, thereby producing at least some of the charged particles.

The gas can be supplied in a manner resulting in adiabatic cooling of the gas as the gas is supplied into the first and second spaces. The second portion of the gas can be made to flow at a bleed rate compared to the first portion.

The foregoing and additional features and advantages of apparatus and methods as disclosed herein will be more apparent from the following detailed description, which proceeds with reference to the accompanying drawings.

DETAILED DESCRIPTION

This disclosure is set forth in the context of representative embodiments, which are not intended to be limiting in any way.

Figure 1:
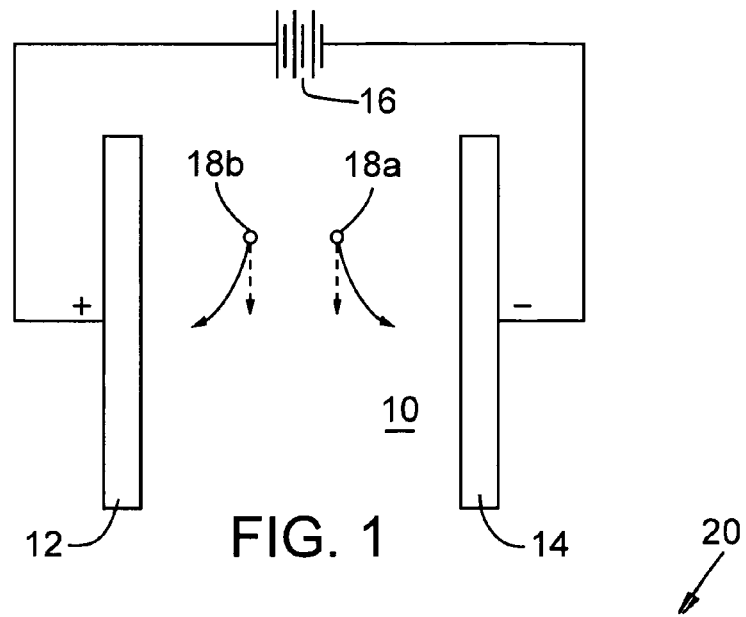
FIG. 1 is a schematic diagram showing general principles of electrophoresis as applied in various embodiments described herein.

The embodiment described below exploits not only principles of thermophoresis but also a phenomenon termed "electrophoresis." Thermophoresis is defined above. In the current context, electrophoresis generally involves the migration, in space, of charged particles under the influence of an applied voltage gradient in the space. In this regard, reference is made to FIG. 1, which depicts a space 10 flanked by a first electrode 12 and a second electrode 14. The electrodes 12, 14 are respectively charged by connection to a voltage source 16. If a particle 18a, 18b entering the space 10 has a net electrical charge, then the particle 18a, 18b will experience an electrostatic attraction to one or the other of the electrodes 12, 14, depending upon the polarity and magnitude of charge of the particle and the polarity and magnitude of the charge of the respective. electrode. In general, a positively charged particle 18a will be attracted to the negatively charged (cathodic) electrode 14, and a negatively charged particle 18b will be attracted to the positively charged (anodic) electrode 12.

Figure 2A:
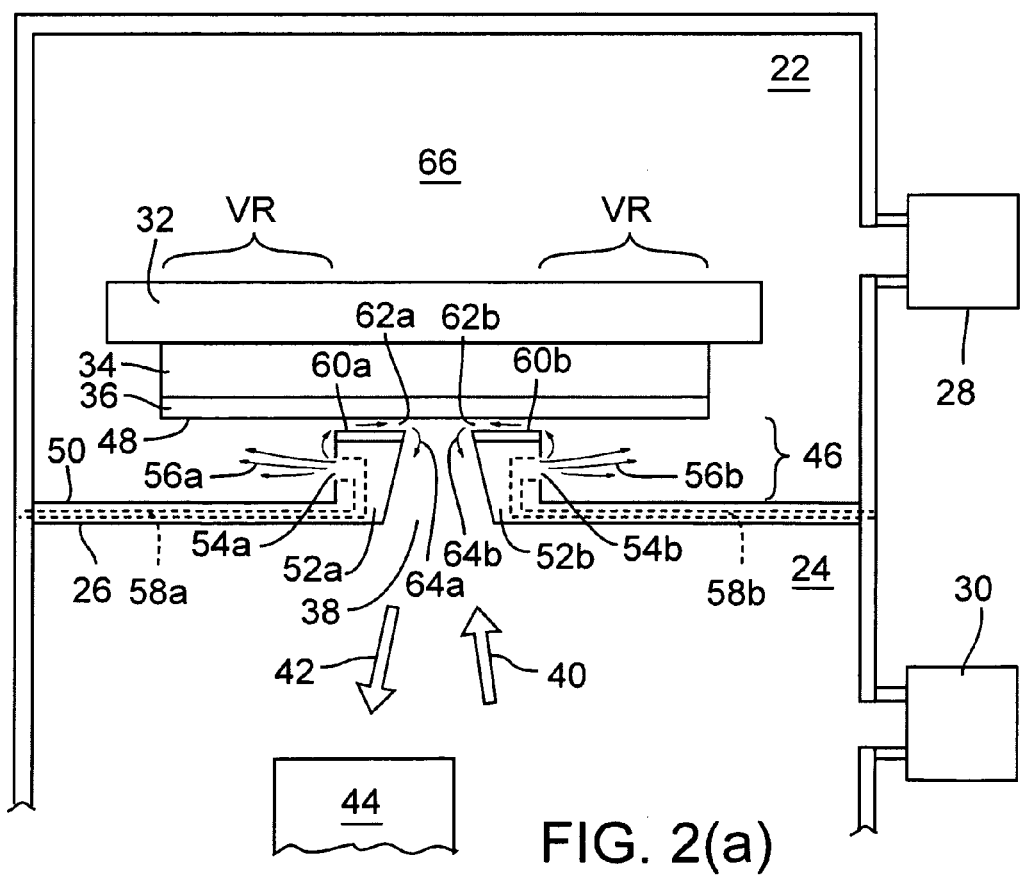
FIG. 2(a) is a schematic elevational view of a portion of a representative embodiment of a reticle-protection device.
Figure 2B:
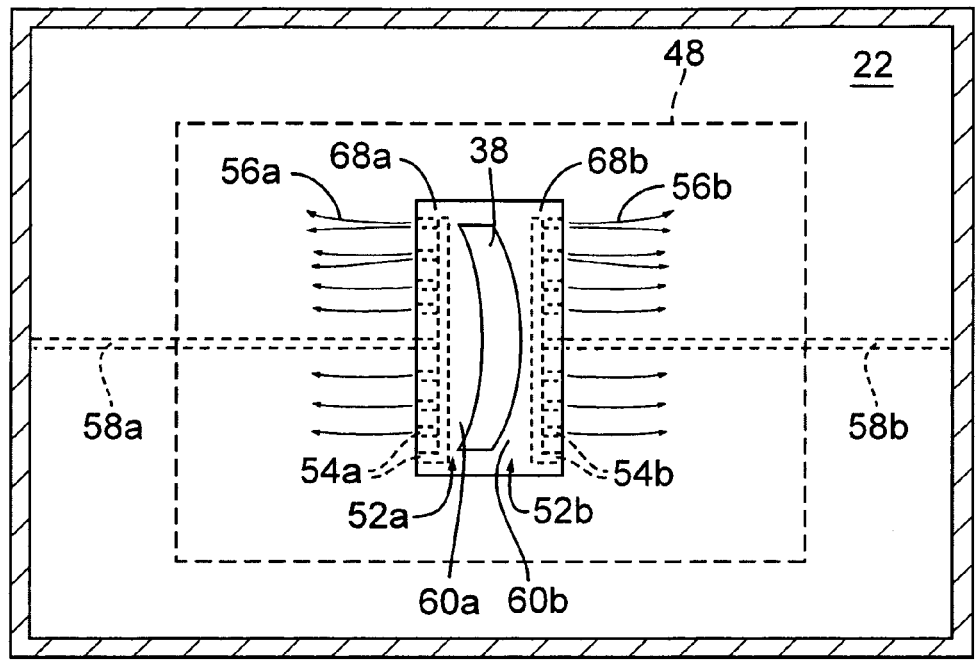
FIG. 2(b) is a schematic plan view of a portion of the device shown in FIG. 2(a), depicting an exemplary shape of the fixed aperture and the gas-discharge nozzle structures.

A representative embodiment of the subject apparatus 20 is shown in FIGS. 2(a)-2(b). The apparatus comprises a first (upper) chamber 22 and a second (lower) chamber 24 separated from each other by a barrier wall 26. Each of the first and second chambers 22, 24 is a respective vacuum chamber that is evacuated by a respective vacuum pump 28, 30 to a respective vacuum level. The first chamber 22 contains a reticle stage 32 on which a reticle chuck 34 is mounted, facing downward in a manner characteristic of a reticle chuck intended to hold an EUVL reticle. The reticle chuck 34 is shown holding a reticle 36.

The barrier wall 26 defines a "fixed aperture" 38 that serves the following two functions: a differential pumping aperture and a reticle-illumination aperture. As a differential pumping aperture, the fixed aperture 38 is configured (especially due to its nozzle manifold and electrode, described later below) to facilitate attainment, by the vacuum pumps 28, 30, of the desired vacuum levels in each of the first and second chambers 22, 24. For example, the first and second chambers (the first chamber 22 is typically at approximately 50 mTorr (6.6 Pa), and the second chamber 24 is typically at less than 1 mTorr (0.1-0.2 Pa). The higher pressure in the first chamber is advantageous for effective viscophoresis and thermophoresis, and the lower pressure in the second chamber is advantageous for high transmission of EUV radiation in the second chamber. As a reticle-illumination aperture, the fixed aperture 38 is sized and configured (typically with an arc-shape; see FIG. 2(b)) to pass an EUV illumination beam 40 to illuminate a desired region on the reticle 36 and to pass patterned EUV light 42 reflected from the reticle and propagating to projection optics 44 contained in the second chamber 24.

The reticle stage 32 and reticle chuck 34 cooperatively hold the reticle 36 such that a space 46 is defined between the lower surface 48 of the reticle and the top surface 50 of the barrier wall 26. By way of example, the vertical dimension (thickness) of the space 46 is 10-13 mm. During exposure, to illuminate successive regions of the reticle 36 through the fixed aperture 38, the reticle stage 32 moves in a scanning manner relative to the fixed aperture. The reticle chuck 34 desirably is temperature-controlled to establish a desired temperature of the reticle 36. Temperature control of the reticle 36 is advantageous for effective thermophoresis, as described later below.

Flanking the fixed aperture 38 are nozzle manifolds 52a, 52b that extend upward (in the figure) from the upper surface 50 of the barrier wall 26 toward the reticle 36. The nozzle manifolds 52a, 52b define gas-discharge nozzle openings 54a, 54b that are configured and oriented for discharging gas 56a, 56b (supplied by conduits 58a, 58b) laterally into the space 46, substantially parallel to the reticle 36. The flow of gas laterally through the space 46 is approximately laminar, and the number, size, and shape of the nozzle openings 54a, 54b desirably are selected so as to establish and maintain this approximately laminar flow. At the low pressures employed in this invention, laminar flow can be only approximately achieved. As indicated by the multiple arrows 56a, 56b, most of the discharged gas flows laterally, substantially parallel to the reticle 36 and outwardly toward the edges of the reticle, and ultimately is exhausted via the vacuum pump 28. This approximately laminar flow of gas pulls particles with it by viscous drag ("viscophoresis"); thus, the region between the nozzle openings 54a, 54b and the edge of the reticle 36 is termed the "viscophoresis region" VR in which particles are moved, while entrained in the gas, laterally away from the reticle 36 and are not allowed to move toward the reticle surface 48. The flow of gas in the viscophoresis region VR remains largely unchanged as the reticle 36 is scanned back and forth by the reticle stage 32 during exposure. The flow velocity of the gas desirably is in the range of approximately 5 m/sec to several hundred m/sec. Reticle-stage velocities are determined by the throughput of the lithography system, but a typical reticle-stage velocity is approximately 1 m/sec. Thus, movement of the reticle stage would have little effect on the gas flow.

The nozzle manifolds 52a, 52b are topped by an electrode plate (described later below) having respective "top" surfaces 60a, 60b that define respective narrow gaps 62a, 62b (approximately 1 mm or less) relative to the lower surface 48 of the reticle 36. These gaps 62a, 62b allow limited vertical movement of the reticle 36 as required for focus control and alignment purposes. These gaps 62a, 62b also allow a flow of gas (albeit constrained, note single arrows 64a, 64b indicating a "bleed" flow, compared with the greater flow indicated by the arrows 56b) from the space 46 through the fixed aperture 38 to the projection-optics chamber 24. Note that this constrained flow is in directions that are opposite the respective directions of most of the gas flow from the nozzle openings 52a, 52b.

The gas can be pre-cooled before being discharged into the space 46 between the reticle 36 and barrier wall 26. Alternatively, and more desirably, the nozzle discharge openings 54a, 54b are sized and configured to establish a substantially higher gas pressure at the nozzle openings than in the space 46 between the reticle 36 and barrier wall 26 or in the space 66 above the reticle, for example. Thus, in this alternative scheme, discharge of the gas is accompanied by adiabatic cooling of the gas. I.e., as the gas is discharged into the space 46, it expands rapidly out of the nozzle openings 54a, 54b and cools significantly in the process. In such a configuration, the supply temperature of the gas relative to the temperature of the reticle 36 is of little consequence because in any event the discharged gas expanding into the space 46 becomes colder than the reticle 36 and barrier wall 28, thereby establishing the desired temperature gradient for thermophoresis without having to pre-cool the gas. The relatively high gas pressure at the nozzle openings 54a, 54b produces high-velocity gas flow through the viscophoresis region VR toward the edges of the reticle 36, which establishes a substantial viscous drag on any particles present in the space 46. Thus, particles are conveyed out of the space 46 away from the reticle 36. Most of the gas ultimately is removed by the vacuum pump 28.

The number, size, and shape of the nozzle openings 54a, 54b desirably are selected so as to establish the conditions for adiabatic cooling of the gas. Alternatively, the nozzle openings 54a, 54b may be single large openings that are covered by respective particle filters (not shown). The effective pore size of the particle filters is small, thereby providing both protection of the reticle from particles that may enter the space 46 with the gas flow and conditions appropriate for adiabatic cooling of the expanding gas. The gas flow at the entrance to the space 46 desirably is subsonic because supersonic gas flow tends to generate shock waves and heating of the ambient gas rather than the desired cooling. The gas emerges into the space 46 at subsonic velocities if the nozzle openings 54a, 54b or the filter pores are smaller than the molecular mean path of the gas. At the ambient pressures the molecular mean path is typically a fraction of a millimeter.

The gas discharged from the nozzle openings 54a, 54b may be a light gas such as helium or hydrogen, a heavier gas such as nitrogen, or one of the noble gases, or a mixture of two or more of these gases. Since nitrogen is relatively inexpensive, and is used as a system gas in gas bearings (not shown) such as in the reticle stage 32, nitrogen is an advantageous candidate gas for discharge by the nozzle openings 54a, 54b. Any of these gases tend to absorb EUV radiation.

Desirably, the reticle 36 and barrier wall 26 are at substantially the same temperature. (The reticle 36 and barrier wall 26 can have different temperatures, so long as they are warmer than the temperature of the gas discharged into the space 46.) To maintain the reticle 36 and the barrier wall 26 at their respective desired temperatures as heat is being removed from them by the discharged gas, the reticle and barrier wall can be heated. In addition, to facilitate temperature control of the barrier wall 26, thermal insulation (not shown) can be used to isolate the barrier wall thermally from nearby structure. The reticle 36 and the barrier wall 26 can be heated by any suitable mechanism. By way of example, the reticle 36 can be heated by the EUV radiation 40 passing through the fixed aperture 38 and impinging on the reticle 36. This radiative heating alone may be sufficient for heating the reticle 36. Alternatively or in addition, the reticle 36 can be heated by thermal conduction via a temperature-controlled reticle chuck 34. The barrier wall 26 can be heated hydraulically using fluid-circulation coils, electrically using a resistance heater, or radiatively using a radiative heater. Removal of heat from the reticle 36 and barrier wall 26 by the discharged gas is typically proportional to the heat capacity of the gas. Because of the low pressure of the discharged gas, its heat capacity is relatively small, and the rate of heat removal from the reticle 36 and barrier wall 26 by the gas is typically small. Consequently, the amount of heat energy to supply to the reticle 36 and barrier wall 26 is typically small.

Figure 3:
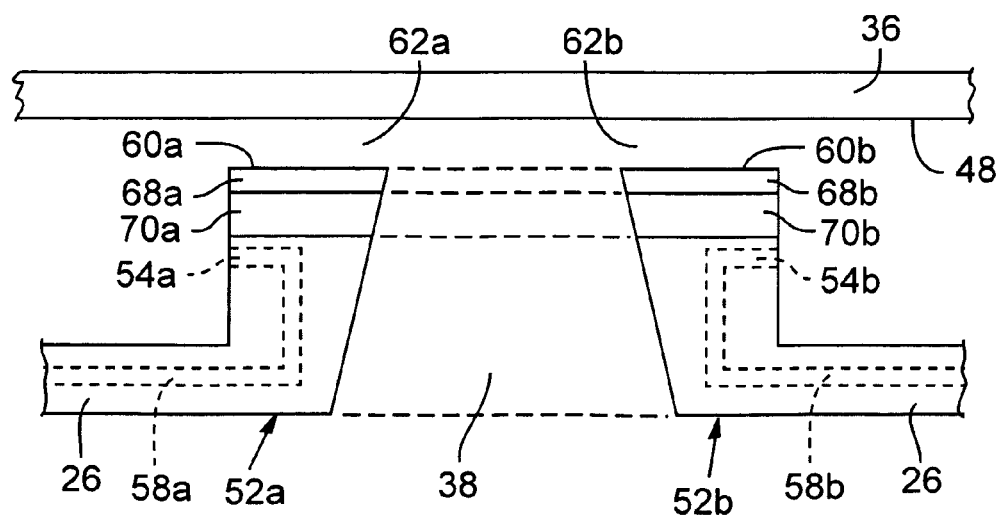
FIG. 3 is schematic elevational view showing details of the nozzle structures and electrodes.

Referring now to FIG. 3, details of the nozzle manifolds 52a, 52b and nozzle openings 54a, 54b are shown. In the depicted embodiment, each nozzle manifold 52a, 52b includes, extending along its "top" surface 60a, 60b, a respective electrode 68a, 68b (The nozzle manifolds 52a, 52b can be constructed as a single unit (see FIG. 2(b)) having a "left" portion 52a and a "right" portion 52b.) The electrodes 68a, 68b desirably are configured a single unit (with a "left" portion 68a and a "right" portion 68b), but they may be separate if desired. The electrodes 68a, 68b collectively form a "fixed" blind, usually having an arc-shaped opening (see FIG. 2(b)). It is this fixed blind that gives the fixed aperture 38 its name. If the nozzle manifolds 52a, 52b are made of metal, the electrodes 68a, 68b desirably are electrically insulated from the respective nozzle manifolds by a region of dielectric material 70a, 70b. Structures that may absorb EUV radiation typically are electrically conductive or are provided with a conductive coating, and are connected to electrical ground. Insulated surfaces exposed to EUV radiation typically charge up to a finite voltage, which creates an electric field that may attract or divert particles to the vicinity of the reticle or other particle-sensitive surfaces. If the electrodes 68a, 68b are electrically insulated, the insulation desirably is protected from exposure by the EUV by means of an electrical shield or by placement in the shadow of a conducting body.

Figure 4:
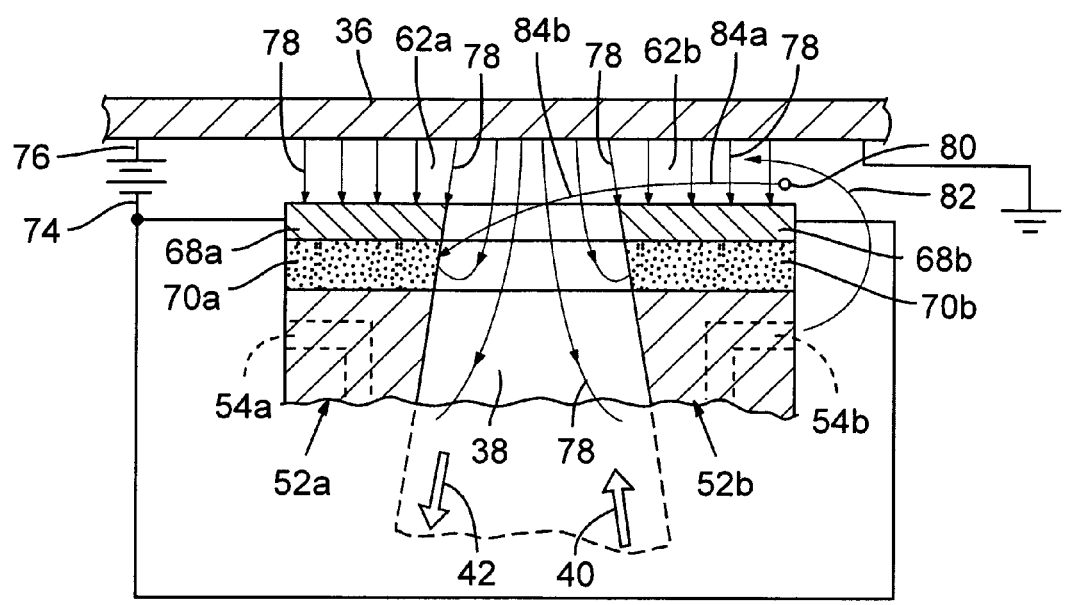
FIG. 4 is a schematic elevational view similar to FIG. 3 but also showing an exemplary manner in which the electrodes can be connected to a voltage source.

Turning now to FIG. 4, the electrodes 68a, 68b are electrically connected to a voltage source 72, typically to the negative pole 74 of a DC-power source 72 (producing a DC voltage in the range of, e.g., 1-50 V DC). The reticle 36 in such a scheme is connected to the positive pole 76 of the DC-power source 72 and is typically also connected to electrical ground. When energized, the electrodes 68a, 68b produce an electrical field having field lines 78, of which some are shown in FIG. 4. The electrodes 68a, 68b constitute respective portions of an electrophoresis unit situated at the fixed aperture 38 and relative to the gaps 62a, 62b. The electrophoresis unit deflects particles, in the gas passing through the gaps 62a, 62b toward the fixed aperture 38, away from the portion of the reticle surface 48 located adjacent the fixed aperture and gaps. More specifically, an initially uncharged particle 80 being carried into a gap 62a, 62b by the higher-pressure flow of gas (arrow 82) near the nozzle openings 54a, 54b becomes positively charged by the incident EUV radiation 40 and reflected EUV radiation 42. The now-charged particle 80 experiences the field produced by the electrodes 68a, 68b and thus is deflected downward toward the fixed aperture 38. The particle 80 is assumed to be uncharged initially, so its trajectory 84a in the gap 62a is unaffected by the field lines 78 of the electric field. (The trajectory 84a is shown as a straight line. However, forces from the gas flow may in fact alter the trajectory 84a from a straight line.) After encountering the EUV radiation the particle becomes charged, and its trajectory 84b is influenced by the electric field.

Particles in the gas entering the fixed aperture 38 from the gaps 62a, 62b encounter EUV radiation 40 (FIG. 2(a)) illuminating the reticle 48 through the fixed aperture. The EUV radiation 40 imparts charges to the particles by the photoelectric effect, causing the particles to acquire mostly a net positive charge. The electric field 78 created by the negatively charged electrodes 68a, 68b near the reticle 36 deflects the positively charged particles downward, away from the reticle 36. The electric field 78 is localized near the reticle 36 to minimize the possibility of positively charged particles below the electrodes 68a, 68b from being attracted toward the reticle.

Any particles in the space 46 have been assumed to be electrically neutral. Some particles may become positively charged by the photoelectric effect, notably from EUV radiation that has scattered from the surface of the reticle 36 into the space 46. These particles would be attracted even more efficiently to the electrodes 68a, 68b. Although a mechanism is not currently known, if some particles do acquire a negative charge in the space 46 and are conveyed by the gas flow near the electrodes 68a, 68b, they undesirably will be driven by the electric field toward the surface of the reticle 36. A means of avoiding this situation is to provide a flow of positive gas ions from the nozzle manifolds 52a, 52b into the space 46. These ions can neutralize any negatively charged particles in the space 46 and prevent them from being driven toward the surface of the reticle 36 by the electrodes 68a, 68b. These ions may be produced by, e.g., a positive corona discharge, whereby a positively charged set of sharp conductive points removes electrons from adsorbed gas atoms, giving them a positive charge and repelling them from the points.

Figure 5:
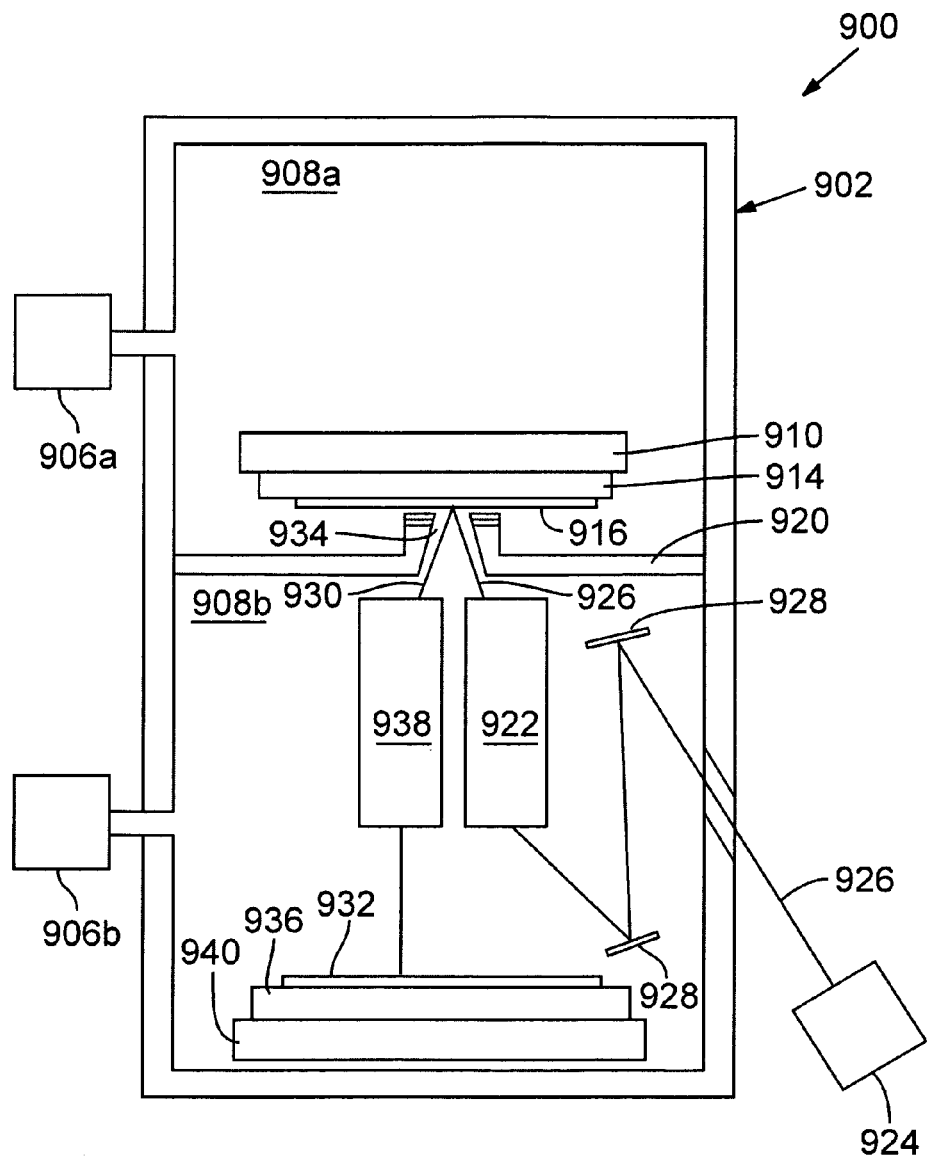
FIG. 5 is a schematic elevational view of an EUV lithography system including a reticle-protection device as disclosed herein.

Referring now to FIG. 5, an embodiment of an EUVL system 900 is shown. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 holds the reticle 916 and allows the reticle to be moved laterally in a scanning manner, for example, during use of the reticle for making lithographic exposures. An illumination source 924 produces an EUV illumination beam 926 that enters the optical chamber 908b and reflects from one or more mirrors 928 and through an illumination-optical system 922 to illuminate a desired location on the reticle 916. As the illumination beam 926 reflects from the reticle 916, the beam is "patterned" by the pattern portion actually being illuminated on the reticle. The barrier wall 920 serves as a differential-pressure barrier and can serve as a reticle shield that protects the reticle 916 from particulate contamination during use. The barrier wall 920 defines an aperture 934 through which the illumination beam 926 may illuminate the desired region of the reticle 916. The incident illumination beam 926 on the reticle 916 becomes patterned by interaction with pattern-defining elements on the reticle, and the resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 922 and projection-optical system 938) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

Figure 6:
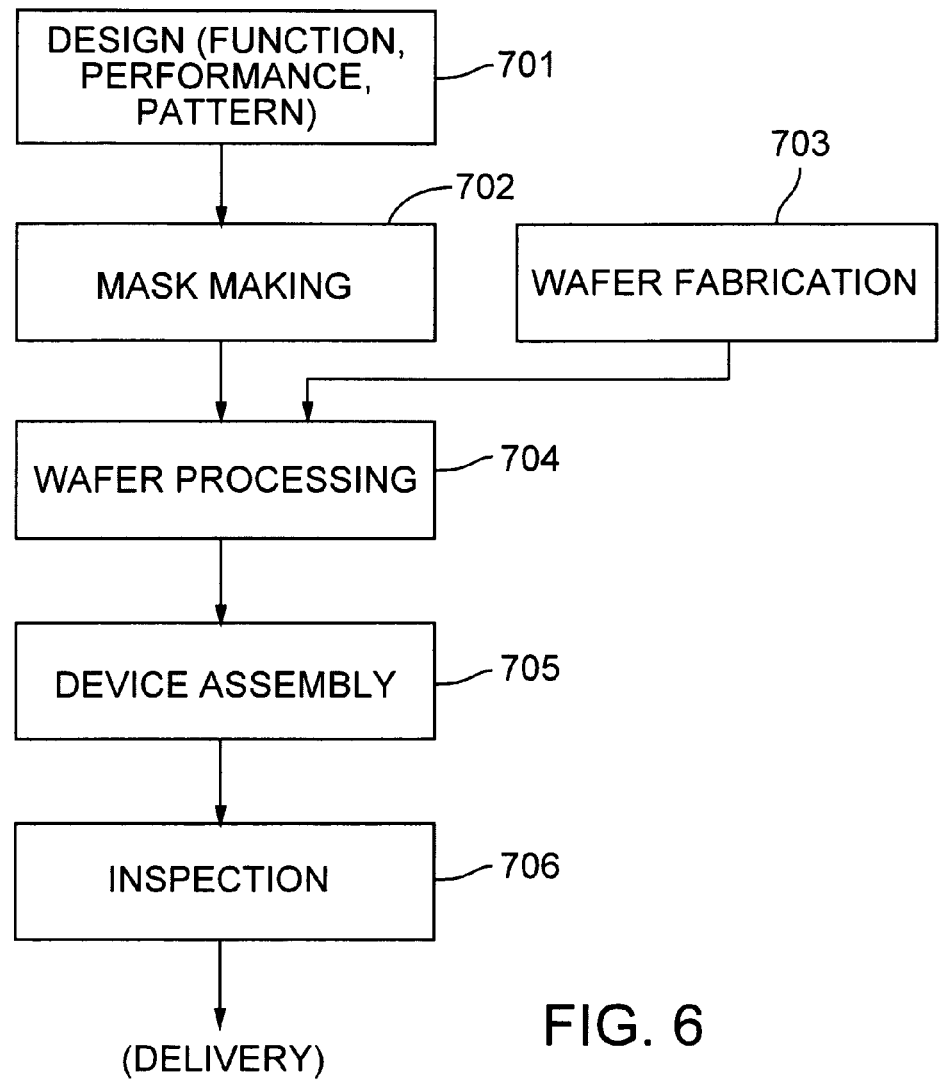
FIG. 6 is a process-flow diagram illustrating exemplary steps associated with a process for fabricating semiconductor devices.

Semiconductor devices can be fabricated by processes including microlithography steps performed using a microlithography system as described above. Referring to FIG. 6, in step 701 the function and performance characteristics of the semiconductor device are designed. In step 702 a reticle ("mask") defining the desired pattern is designed and fabricated according to the previous design step. Meanwhile, in step 703, a substrate (wafer) is fabricated and coated with a suitable resist. In step 704 ("wafer processing") the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 706 the assembled devices are tested and inspected.

Figure 7:
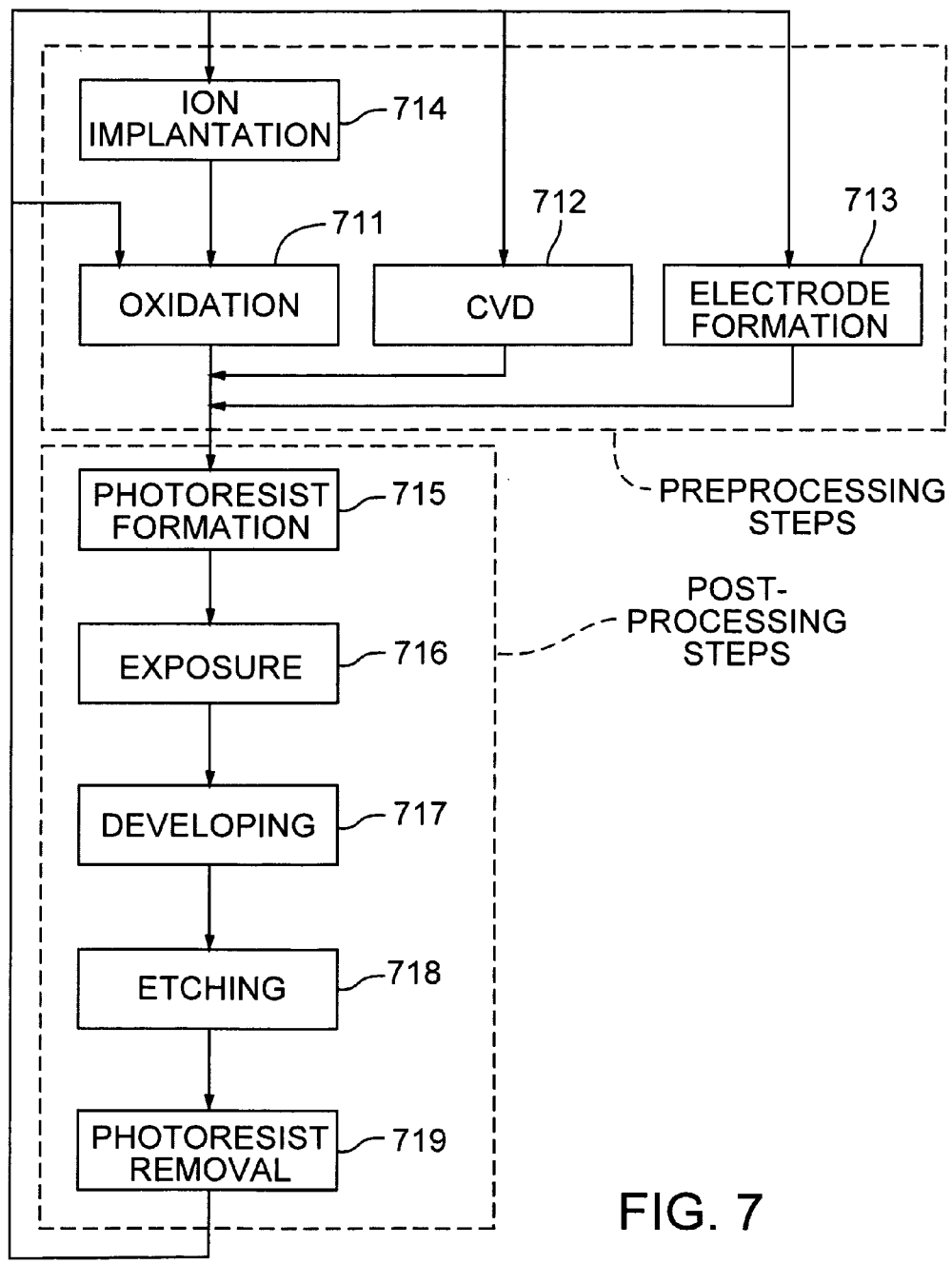
FIG. 7 is a process-flow diagram illustrating exemplary steps associated with processing a substrate (wafer), as would be performed, for example, in step 704 in FIG. 6.
Figure 8:
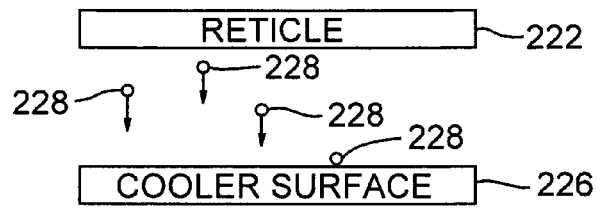
FIG. 8 is a schematic diagram showing general principles of thermophoresis.
Figure 9:
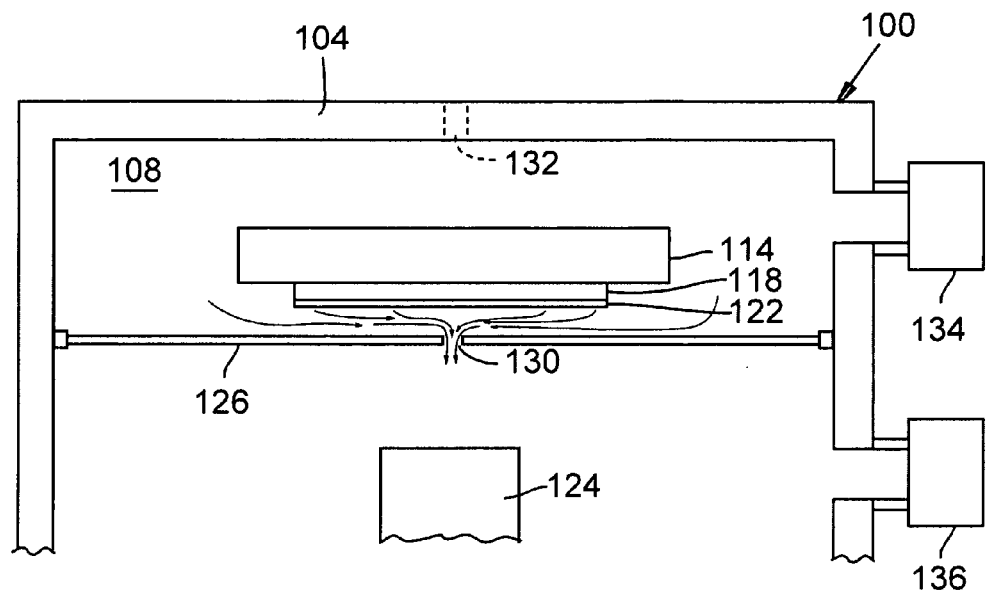
FIG. 9 is a schematic elevational view of a portion of an EUV lithography system that exploits thermophoresis for protecting the reticle according to one manner as known in the art.
Figure 10:
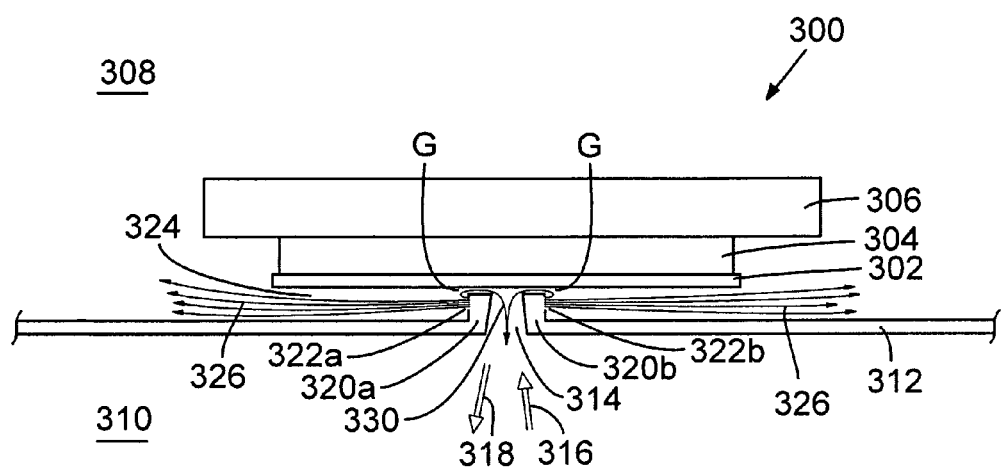
FIG. 10 is a schematic elevational view in the vicinity of a reticle stage of an EUV lithography system that exploits thermophoresis for protecting the reticle according to another manner as known in the art.

Representative details of a wafer-processing process including a microlithography step are shown in FIG. 7. In step 711 ("oxidation") the wafer surface is oxidized. In step 712 ("CVD") an insulative layer is formed on the wafer surface by chemical-vapor deposition. In step 713 (electrode formation) electrodes are formed on the wafer surface by vapor deposition, for example. In step 714 ("ion implantation") ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 ("photoresist formation") in which a suitable resist is applied to the surface of the wafer. Next, in step 716 ("exposure"), the microlithography system described above is used for lithographically transferring a pattern from the reticle to the resist layer on the wafer. In step 717 ("developing") the exposed resist on the wafer is developed to form a usable mask pattern, corresponding to the resist pattern, in the resist on the wafer. In step 718 ("etching"), regions not covered by developed resist (i.e., exposed material surfaces) are etched away to a controlled depth. In step 719 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

In the embodiment described above, the barrier wall 26 was described as defining the fixed aperture 38. Alternatively, the fixed aperture can be defined in any suitable structure, such as a reticle shield, which may be stationary or movable. Also, in certain embodiments, the nozzle manifolds 52*a*, 52*b* (with attached electrodes 68*a*, 68*b*) can constitute an independently movable assembly, relative to the barrier wall 26 or analogous structure. Such movability can facilitate certain calibration operations (e.g., focus position of the reticle) that are more easily performed with the nozzle manifolds and electrodes moved out of the way.

It will be apparent to persons of ordinary skill in the relevant art that various modifications and variations can be made in the system configurations described above, in materials, and in construction without departing from the spirit and scope of this disclosure.

What is claimed is:

1. An apparatus for reducing particle contamination of a reticle surface, the apparatus comprising:
    a reticle-holding device that holds a reticle on a surface of the reticle-holding device;
    a thermophoresis device situated relative to and spaced from the surface of the reticle-holding device, the thermophoresis device producing a thermophoretic force, in a gas flowing past and contacting a surface of the reticle being held by the reticle-holding device, sufficient to inhibit particles in the gas from contacting the reticle surface; and
    an electrophoresis device situated relative to and spaced from the surface of the reticle-holding device and situated relative to a region of the reticle surface contacted by the gas, the electrophoresis device being configured to deflect particles, having an electrostatic charge, in the gas away from the region as the gas flows past the region.

2. The apparatus of claim 1, wherein:
the thermophoresis device produces the thermophoretic force by establishing a temperature gradient in the gas relative to the reticle being held by the reticle-holding device; and
the electrophoresis device comprises an electrode situated and configured to produce a voltage gradient relative to the region of the reticle being held by the reticle-holding device, the voltage gradient being sufficient to attract charged particles away from the region of the reticle surface.

3. The apparatus of claim 1, wherein:
the region is irradiated by a lithographic energy beam propagating to the reticle surface along an irradiation path;
the thermophoresis device is configured to deliver a flow of the gas in a first direction relative to the reticle surface, the gas being at a temperature appropriate for producing the thermophoretic force, and to direct a portion of the gas flow, in the vicinity of the region, in a second direction opposite the first direction and then away from the region along a trajectory including at least a portion of the irradiation path so as to allow the lithographic energy beam to impart charges to the particles in the directed portion of the gas flow in the second direction; and
the electrophoresis device is configured to deflect the charged particles, in the directed portion of the gas flow, away from the region.

4. The apparatus of claim 3, wherein:
the reticle surface is reflective; and
the lithographic energy beam is a beam of extreme ultraviolet light.

5. An apparatus for reducing particle contamination of a reticle surface, the apparatus comprising:
a reticle-holding device that holds a reticle on a surface of the reticle-holding device;
a thermophoresis device situated relative to and spaced from the surface of the reticle-holding device and configured to flow a gas stream in a space substantially parallel to a surface of a reticle being held by the reticle-holding device, the gas stream having a temperature lower than a temperature of the reticle surface so as to establish a thermophoretic temperature gradient between the gas and the reticle surface, the temperature gradient creating a thermophoretic force inhibiting particles from contacting the reticle surface; and
an electrophoresis device situated relative to and spaced from the surface of the reticle-holding device and situated relative to the reticle surface and the thermophoresis device, the electrophoresis device comprising at least one electrode situated in the gas stream, the at least one electrode being configured, when energized, to establish a voltage gradient in the gas stream urging migration of charged particles in the gas away from the reticle surface.

6. The apparatus of claim 5, wherein the thermophoresis device comprises a gas-discharge nozzle that flows the gas stream by discharging the gas stream in a manner by which the gas is adiabatic cooled so as to establish the thermophoretic temperature gradient.

7. The apparatus of claim 5, wherein the thermophoresis device is further configured to bleed off a portion of the gas stream, in a space adjacent a region of the reticle surface, to the electrophoresis device.

8. The apparatus of claim 5, wherein the at least one electrode of the electrophoresis device is connected to a DC-voltage source.

9. The apparatus of claim 5, wherein the reticle being held by the reticle-holding device is configured to be irradiated by a lithographic energy beam under a vacuum condition.

10. The apparatus of claim 9, further comprising a first vacuum chamber, a second vacuum chamber, and a barrier wall separating the first and second vacuum chambers, wherein:
the reticle-holding device is in the first vacuum chamber;
the barrier wall defines an opening allowing the first and second vacuum chambers to communicate with each other; and
the opening is situated so as to allow the lithographic energy beam to pass from the second vacuum chamber to the first vacuum chamber in which the lithographic energy beam illuminates a selected region on the reticle being held by the reticle-holding device and reflects from the selected region, back into the second vacuum chamber.

11. The apparatus of claim 10, wherein:
the surface of the reticle-holding device in the first vacuum chamber is situated substantially parallel to the barrier wall, thereby defining a substantially uniform-width space between the surface of the reticle-holding device and the baffler wall;
the thermophoresis device is configured to flow the stream of gas substantially parallel to the reticle being held by the reticle-holding device and baffler wall through the space, and to bleed off a portion of the stream through the opening from the space into the second chamber away from the reticle; and
the at least one electrode of the electrophoresis device attracts the charged particles, in the bled-off portion of the stream, exiting the first chamber through the opening, to move away from the reticle.

12. The apparatus of claim 11, wherein the lithographic energy beam is a beam of extreme ultraviolet light.

13. The apparatus of claim 11, wherein the lithographic energy beam has sufficient energy to impart charges to particles entrained in the bled-off portion of the gas stream, so as to render the particles attractive to the at least one electrode.

14. An apparatus for reducing particle contamination of a lithographic reticle surface, the apparatus comprising:
reticle-holding means including surface means for holding a lithographic reticle;
thermophoresis means for producing a thermophoretic force, in a gas flowing past and contacting the reticle surface, sufficient to inhibit particles in the gas from contacting the reticle surface; and
electrophoresis means for deflecting particles, having an electrostatic charge, in the gas away from a region of the reticle surface contacted by the gas as the gas flows past the region.

15. An apparatus for reducing particle contamination of a lithographic reticle surface, the apparatus comprising:
reticle-holding means including surface means for holding a lithographic reticle;
thermophoresis means for flowing a gas stream, having a temperature lower than a temperature of the reticle surface, in a space substantially parallel to the reticle surface so as to establish a thermophoretic temperature gradient between the gas and the reticle surface, and for creating, from the temperature gradient, a thermophoretic force inhibiting particles from contacting the reticle surface; and electrophoresis means for establishing a voltage gradient urging migration of charged particles in the gas stream away from the reticle surface.

16. The apparatus of claim 1, further comprising a reticle stage that supports the reticle-holding device and moves the reticle-holding device along at least one direction.

17. The apparatus of claim 5, further comprising a reticle stage that supports the reticle-holding device and moves the reticle-holding device along at least one direction.

* * * * *

UNITED STATES PATENT AND TRADEMARK OFFICE
CERTIFICATE OF CORRECTION

PATENT NO. : 7,367,138 B2 Page 1 of 1
APPLICATION NO. : 11/248931
DATED : May 6, 2008
INVENTOR(S) : Michael R. Sogard It is certified that error appears in the above-identified patent and that said Letters Patent is hereby corrected as shown below:

Column 10, line 43, "respective. electrode." should be --respective electrode.--.

Column 18, line 28, "baffler" should be --barrier--.

Column 18, line 31, "baffler" should be --barrier--.

Signed and Sealed this

Twenty-fifth Day of November, 2008

JON W. DUDAS
*Director of the United States Patent and Trademark Office*